United States Patent

Sawada et al.

[11] Patent Number: 6,012,192
[45] Date of Patent: Jan. 11, 2000

[54] SUBSTRATE PROCESSING APPARATUS

[75] Inventors: Atsushi Sawada; Yasuhiko Okuda; Shouji Komatsubara, all of Shiga-ken, Japan

[73] Assignee: Dainippon Screen Mfg. Co., Ltd., Japan

[21] Appl. No.: 09/059,897

[22] Filed: Apr. 14, 1998

[30] Foreign Application Priority Data

Apr. 21, 1997 [JP] Japan .................................. 9-103554

[51] Int. Cl.[7] .................................................. A46B 13/04
[52] U.S. Cl. .................................. 15/77; 15/88.2; 15/102; 414/433; 414/936; 134/153; 134/902
[58] Field of Search .......................... 15/77, 88.2, 88.3, 15/97.1, 102; 134/153, 902; 414/433, 936

[56] References Cited

U.S. PATENT DOCUMENTS

| 5,351,360 | 10/1994 | Suzuki et al. | 15/97.1 |
| 5,566,465 | 10/1996 | Hearne | 414/936 |
| 5,860,181 | 1/1999 | Maekawa et al. | 15/77 |
| 5,916,366 | 6/1999 | Ueyama et al. | 134/153 |

FOREIGN PATENT DOCUMENTS

| 2488157 | 2/1982 | France | 15/88.3 |
| 1-259536 | 10/1989 | Japan . | |

Primary Examiner—Mark Spisich
Assistant Examiner—Theresa T. Snider
Attorney, Agent, or Firm—Ostrolenk, Faber, Gerb & Soffen, LLP

[57] ABSTRACT

A substrate processing apparatus which includes a substrate retention mechanism having retention rollers, including a plurality of driving rollers, for holding a substrate by abutting the retention rollers against different peripheral edge portions of the substrate, and a rotative driving mechanism for rotating the plurality of driving rollers. The plurality of driving rollers preferably include a pair of driving rollers generally opposed to each other diametrically of the substrate to be held. Further, the retention rollers preferably all serve as the driving rollers.

7 Claims, 8 Drawing Sheets

F I G. 3
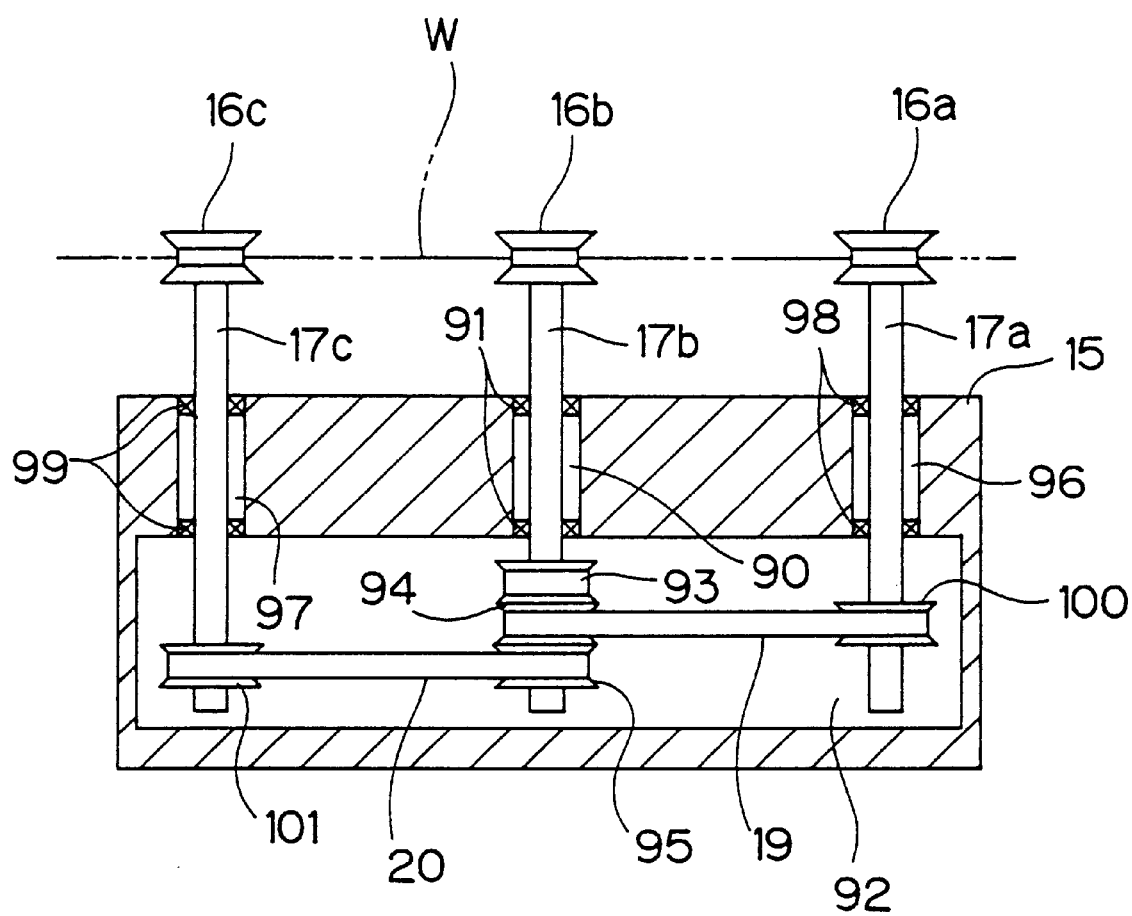

SUBSTRATE PROCESSING APPARATUS

BACKGROUND OF THE INVENTION

1. Field of the Invention

The present invention relates to a substrate processing apparatus for processing a substrate, such as a semiconductor wafer, a glass substrate for a liquid crystal display or a substrate for a plasma display panel (PDP), which has a generally circular configuration.

2. Description of Related Art

A semiconductor device production process generally involves the step of forming a minute pattern on a surface of a semiconductor wafer (hereinafter referred to simply as "wafer") by repeatedly subjecting the wafer to a film forming and etching operation. Since the surface of a wafer and the surface of a thin film formed on a wafer surface should be kept clean for successful micro-processing of the wafer, a wafer cleaning operation is performed as required. For example, after a thin film formed on the surface of a wafer is polished with an abrasive (slurry), the slurry remaining on the wafer surface should be removed.

One exemplary apparatus for cleaning a wafer has three retention rollers 201, 202 and 203 as shown in FIGS. 8 and 9.

FIGS. 8 and 9 are a plan view and a side view, respectively, of the apparatus.

A circular wafer W to be cleaned is maintained horizontally with its periphery abutting against the retention rollers 201 to 203. A scrub-cleaning member 205 having a cleaning disc brush 204 is disposed above the wafer W. The upper surface of the wafer W is scrub-cleaned by rotating the scrub-cleaning member 205 with a contact surface 206 of the cleaning brush 204 being in contact with the upper surface of the wafer W. Another scrub-cleaning member 208 having a cleaning disc brush 207 is disposed below the wafer W. The lower surface of the wafer W is scrub-cleaned by the scrub-cleaning member 208.

When the wafer W is cleaned by the scrub-cleaning members 205 and 208, the wafer W is rotated, for example, clockwise about the rotation center OW of the wafer W as seen in FIG. 8 by the retention roller 201 so that the entire upper and lower surfaces of the wafer W can be scrubbed with the cleaning brushes 204 and 207. More specifically, the apparatus includes a motor 209 for rotating the retention roller 201 as shown in FIG. 8. The rotation force of the motor 209 is transmitted to the retention roller 201, whereby the retention roller 201 is rotated, for example, counterclockwise. As a result, the wafer W having a radius r receives a rotative driving force f exerted along a common tangent line from the retention roller 201, so that a rotation torque f×r is applied to the wafer W to rotate the wafer W clockwise. At this time, the retention rollers 202 and 203 are rotated by the rotation of the wafer W.

With this arrangement, however, the overall wafer W receives a force (eccentric force) having the same magnitude and direction as the rotative driving force f. This results in unstable rotation of the wafer W.

The unstable rotation of the wafer W causes the wafer W to be heavily pressed against one of the retention rollers 201 to 203, whereby a greater friction resistance is generated between the wafer W and the retention roller 201 to 203. As a result, the wafer W or the retention roller 201 to 203 is worn out, so that a greater amount of dust is generated. In addition, the service life of the retention rollers 201 to 203 is shortened.

SUMMARY OF THE INVENTION

It is an object of the present invention to provide a substrate processing apparatus which is capable of rotating a substrate stably.

The substrate processing apparatus according to the present invention comprises a substrate retention mechanism having at least three rotatable retention rollers, including a plurality of driving rollers, for holding a generally circular substrate by abutting the retention rollers against different peripheral edge portions of the substrate, and a rotative driving mechanism coupled to the plurality of driving rollers for rotating the plurality of driving rollers.

With this arrangement, a driving force required for the rotation of the substrate is transmitted to the substrate held by the at least three retention rollers distributively from the plurality of retention rollers to apply a rotation torque to the substrate. With the same torque applied to the substrate, a force (eccentric force) exerted on the overall substrate is reduced in comparison with the prior art in which the rotative driving force is transmitted to the substrate from a single retention roller to apply the rotation torque to the substrate. Thus, the substrate can be rotated more stably. Accordingly, the generation of dust and, hence, the wear-out of the retention rollers can be suppressed.

In accordance with one embodiment of the present invention, the plurality of driving rollers include a pair of driving rollers generally opposed to each other diametrically of the substrate to be held. More specifically, these driving rollers form an angle of 180 degrees with respect to the rotation center of the substrate within a plane including the substrate.

With this arrangement, a rotative driving force applied to the substrate from one of the pair of driving rollers generally opposed to each other diametrically of the substrate is opposite in direction to a rotative driving force applied to the substrate from the other driving roller, so that these rotative driving forces are counterbalanced to each other. Therefore, the force (eccentric force) exerted on the overall substrate can be reduced to ensure stable rotation of the substrate.

The arrangement of the plurality of driving rollers is preferably such that each two of the driving rollers having the same rotative driving force are opposed to each other diametrically of the substrate. In this case, the resultant force of the rotative driving forces applied to the substrate from these two driving rollers is maintained at substantially zero, so that the substrate can be rotated more stably.

Further, the arrangement of retention rollers other than the driving rollers (i.e., following rollers to be rotated by the rotation of the substrate) is preferably such that each two of the following rollers are opposed to each other diametrically of the substrate. In this case, the resultant force of friction resistant forces generated between the substrate and the following rollers is maintained at zero, so that the eccentric force exerted on the substrate can be maintained at substantially zero. Therefore, the substrate can be rotated still more stably.

In accordance with another embodiment of the present invention, the at least three retention rollers all serve as the driving rollers.

With this arrangement, since the retention rollers all serve as the driving rollers, there is no following roller (no retention roller which may otherwise give resistance to the rotation of the substrate), thereby ensuring stable rotation of the substrate. The substrate is not heavily pressed against any of the retention rollers during rotation thereof and, therefore, the generation of dust can be suppressed which may otherwise occur due to frictional contact between the substrate and the retention rollers. In addition, the service life of the retention rollers can be extended.

In accordance with further another embodiment of the present invention, the substrate retention mechanism further includes a pair of retention hands for rotatably supporting the at least three retention rollers, at least one of the pair of retention hands being retractable with respect to the other retention hand. The pair of retention hands are preferably each adapted to support at least one of the driving rollers.

In general, where retention hands for supporting retention rollers are retractable, it is difficult to rigidly mount the retention hands to the apparatus. Therefore, if the substrate has a cut-away portion, such as an orientation flat or a notch, formed in the peripheral portion thereof, the retention rollers are liable to be caught in the cut-away portion, thereby interfering with the rotation of the substrate.

With the aforesaid arrangement, however, a great eccentric force is not exerted on the substrate, so that the retention rollers are prevented from being tightly caught in the cut-away portion of the substrate. Even if any one of the retention rollers is caught in a cut-away portion of the substrate, the retention roller can readily come out of the cut-away portion. Therefore, the retention roller will not interfere with the rotation of the substrate.

Particularly where all the retention rollers are adapted to be rotatively driven, the caught retention roller can readily come out of the cut-away portion because a rotative driving force is applied to the retention roller. Therefore, the possibility that the retention roller fails to come out of the cut-away portion of the substrate to interfere with the rotation of the substrate can be further reduced.

If the retention roller caught in the cut-away portion is a driving roller, the rotative driving force can assuredly be transmitted to the substrate from the driving roller to apply a rotation torque to the substrate.

In accordance with still another embodiment of the present invention, the apparatus further includes a double side cleaning mechanism for cleaning the opposite surfaces of the substrate held by the substrate retention mechanism.

In such a case, the generation of dust from the substrate retention mechanism is reduced, and the opposite surfaces of the substrate can effectively be cleaned. Since the retention rollers abut against the constantly moving peripheral edge of the substrate, peripheral edge portions of the substrate adjacent to the retention rollers can also be cleaned. Thus, the entire substrate can effectively be cleaned.

The foregoing and other objects, features and effects of the present invention will become more apparent from the following description of the preferred embodiments with reference to the attached drawings.

BRIEF DESCRIPTION OF THE DRAWINGS

FIG. 3 is a sectional view schematically illustrating a driving mechanism for rotatively driving retention rollers;

DESCRIPTION OF THE PREFERRED EMBODIMENTS

Figure 1:
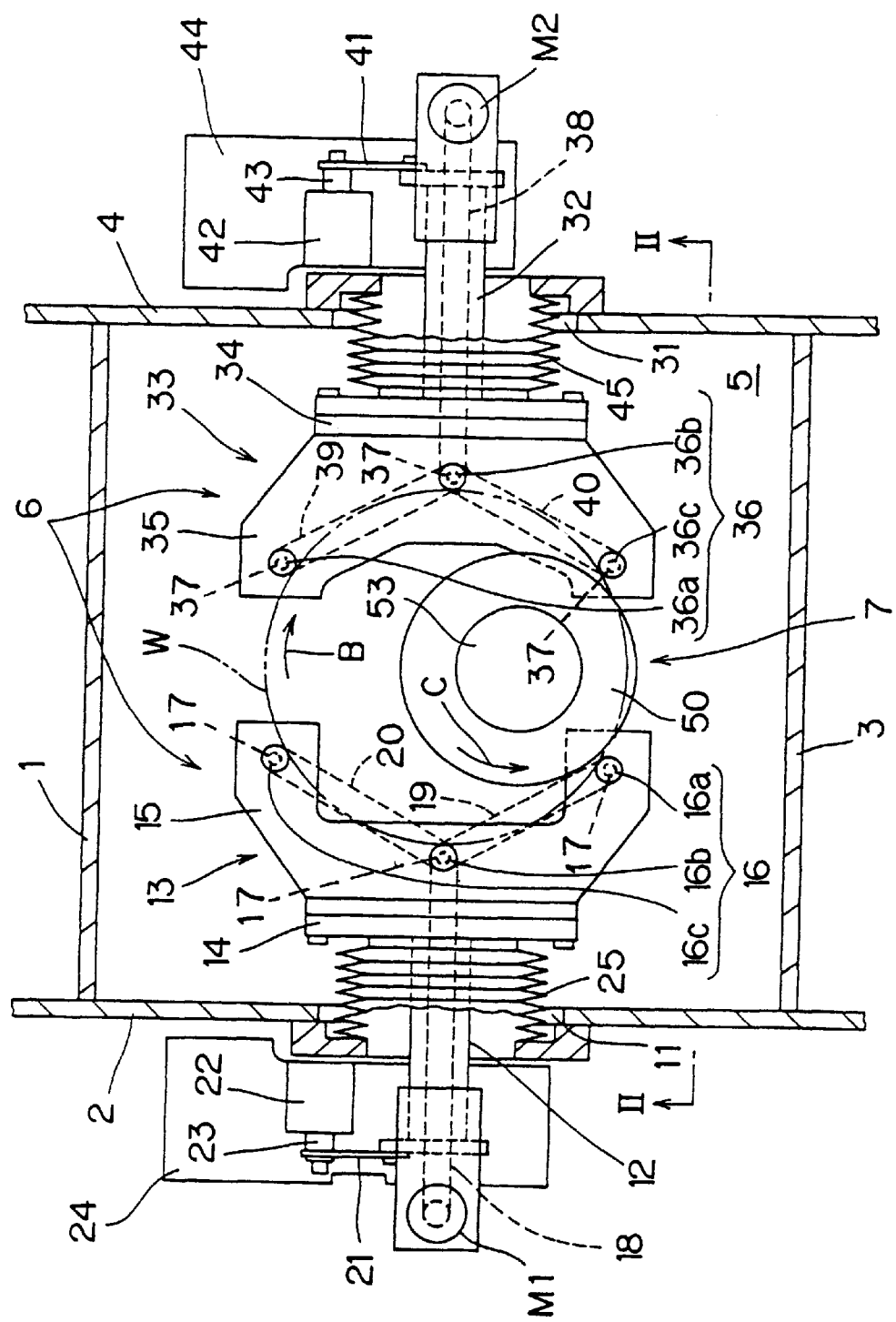
FIG. 1 is a plan view illustrating the construction of a wafer cleaning apparatus as a substrate processing apparatus according to a first embodiment of the present invention.
Figure 2:
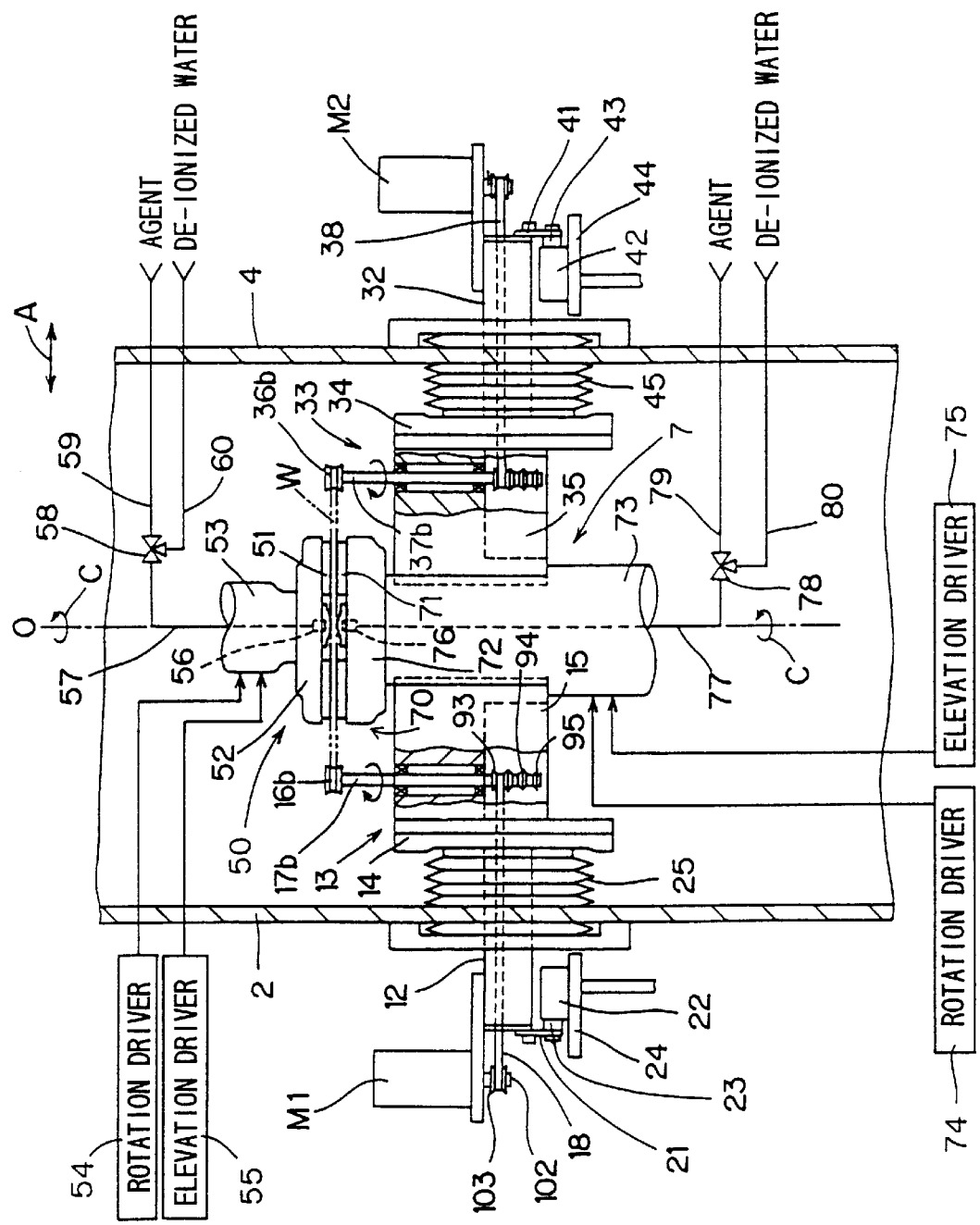
FIG. 2 is a schematic sectional view of the wafer cleaning apparatus taken along a line II—II in FIG. 1.

FIG. 1 is a plan view illustrating the construction of a wafer cleaning apparatus as a substrate processing apparatus according to a first embodiment of the present invention. FIG. 2 is a sectional view of the wafer cleaning apparatus taken along a line II—II in FIG. 1, in which some of the components of the wafer cleaning apparatus are conceptionally illustrated and some of the components are not shown. Referring to FIGS. 1 and 2, the construction of the wafer cleaning apparatus will be described in outline.

The wafer cleaning apparatus is adapted to remove slurry remaining on a surface of a wafer W and unnecessary thin film pieces, for example, after the wafer W is subjected to a chemical mechanical polishing (CMP) process for polishing a thin film formed on the surface of the wafer W. The apparatus includes a processing chamber 5 rectangular in plan and defined by side walls 1, 2, 3 and 4, a wafer retaining device 6 for maintaining a wafer W horizontally within the processing chamber 5 and rotating the wafer W in this state, and a double-side cleaning device 7 for scrub-cleaning the upper and lower surfaces of the wafer W held by the wafer retaining device 6 for removal of the slurry and the like.

The wafer retaining device 6 includes hand shafts 12 and 32 respectively extending, through holes 11 and 31 formed in the side walls 2 and 4, perpendicularly to the side walls 2 and 4, and retention hands 13 and 33 respectively attached to ends of the hand shafts 12 and 32 extending within the processing chamber 5. The retention hands 13 and 33 each includes a base attachment portion 14, 34 attached to the hand shaft 12, 32, a base portion 15, 35 attached to the base attachment portion 14, 34, and three retention rollers 16, 36 provided above the base portion 15, 35 for holding the wafer W.

The base portions 15 and 35 each supports three roller shafts 17, 37 rotatably about vertical axes. The retention rollers 16 and 36 for holding the wafer W are respectively fixed to upper ends of the roller shafts 17 and 37. The wafer W is horizontally maintained with the circumferential edge face thereof abutting against lateral faces of the retention rollers 16 and 36.

In this embodiment, a total of six retention rollers 16 and 36 are disposed in such positions that retention rollers 16a, 16b and 16c are opposed to retention rollers 36a, 36b and 36c, respectively, diametrically of the wafer W with the wafer W held by the respective retention rollers, as shown in FIG. 1. The wafer retaining device 6 according to this embodiment further includes motors M1 and M2 respectively provided outside the side walls 2 and 4 and serving as rotation drivers for generating rotation forces for rotation of the retention rollers 16 and 36. The retention rollers 16 and 36 are rotatively driven by the motors M1 and M2.

More specifically, the rotation force generated by the motor M1 is transmitted via a belt 18 to the central retention roller 16b out of the three retention rollers 16 on the side of the retention hand 13. The rotation force applied to the retention roller 16b is further transmitted to the other two retention rollers 16a and 16c adjacent to the retention roller 16b via belts 19 and 20, respectively. Thus, the three retention rollers 16 on the side of the retention hand 13 are rotatively driven. The rotation force generated by the motor M2 is transmitted via a belt 38 to the central retention roller 36b out of the three retention rollers 36 on the side of the retention hand 33. The rotation force applied to the retention roller 36b is further transmitted to the other two retention rollers 36a and 36c adjacent to the retention roller 36b via belts 39 and 40, respectively. Thus, the three retention rollers 36 on the side of the retention hand 33 are rotatively driven. As a result, the wafer W held by the retention rollers 16 and 36 receives driving forces from the respective retention rollers 16 and 36. Thus, a rotation torque is applied to the wafer W so as to rotate the wafer W at a low speed on the order of 10 to 20 rpm.

Ends of the hand shafts 12 and 32 opposite to the ends thereof to which the retention hands 13 and 33 are attached are respectively coupled via coupling plates 21 and 41 to rods 23 and 43 of cylinders 22 and 42 provided outside the side walls 2 and 4. The cylinders 22 and 42 are respectively fixed to attachment plates 24 and 44 so that the rods 23 and 43 can be moved back and forth perpendicularly to the side walls 2 and 4. With this arrangement, the retention hands 13 and 33 can be moved in opposite directions perpendicularly to the side walls 2 and 4 by driving the cylinders 22 and 42. Thus, the wafer W can be held between the retention rollers 16 and 36 or released from the retention rollers 16 and 36.

In this embodiment, the retention hands 13 and 33 are adapted to be moved toward and away from each other. Alternatively, the arrangement of the retention hands 13 and 33 may be such that one retention hand 13, for example, is stationary with the other retention hand 33 being retractable or such that the retention hand 33 is stationary with the retention hand 13 being retractable.

The double-side cleaning device 7 has an upper surface cleaning member 50 and a lower surface cleaning member 70 respectively disposed above and below the wafer W held by the wafer retaining device 6 as shown in FIG. 2. The upper surface cleaning member 50 and the lower surface cleaning member 70 respectively include cleaning brushes 51 and 71 disposed in positions such as not to interfere with the retention hands 13 and 33 but to cover upper and lower surface portions of the wafer W from the center to the periphery of the wafer W. The upper cleaning member 50 and the lower cleaning member 70 respectively further include brush bases 52 and 72 on which the cleaning brushes 51 and 71 are fixed, and rotary shafts 53 and 73 are fixed to the brush bases 52 and 72.

The rotary shafts 53 and 73 are respectively coupled to rotation drivers 54 and 74 and, when driving forces are applied to the rotary shafts 53 and 73 from the rotation drivers 54 and 74, the upper cleaning member 50 and the lower cleaning member 70 are rotated in a rotation direction C about a vertically extending rotation axis O.

The upper cleaning member 50 and the lower cleaning member 70 are coupled to elevation drivers 55 and 75. In the wafer cleaning, the upper cleaning member 50 and the lower cleaning member 70 are moved toward each other by the elevation drivers 55 and 75, so that the wafer W is held between the cleaning brushes 51 and 71. After completion of the wafer cleaning, the upper cleaning member 50 and the lower cleaning member 70 are moved away from each other by the elevation drivers 55 and 75, so that the cleaning brushes 51 and 71 are brought away from the wafer W.

Cleaning liquid supplying nozzles 56 and 76 for supplying a cleaning liquid to the wafer W are provided around the centers of the cleaning brushes 51 and 71. The cleaning liquid supplying nozzles 56 and 76 are respectively connected to ends of cleaning pipes 57 and 77 extending within the rotary shafts 53 and 73. The other ends of the cleaning pipes 57 and 77 are respectively connected to three-ports valves 58 and 78. The three-ports valves 58 and 78 are respectively connected to agent supplying paths 59 and 79 through which agents such as hydrofluoric acid, nitric acid, hydrochloric acid, phosphoric acid, acetic acid and ammonia are supplied from agent tanks not shown, and also connected to de-ionized water supplying paths 60 and 80 through which de-ionized water is supplied from a de-ionized water tank not shown. With this arrangement, the agents and de-ionized water can selectively be supplied to the cleaning pipes 57 and 77 by controlling the switching of the three-ports valves 58 and 78. Thus, the agents and de-ionized water can selectively be discharged from the cleaning liquid supplying nozzles 56 and 76.

Reference numerals 25 and 45 denote bellows expandable with the movement of the retention hands 13 and 33. The bellows 25 and 45 prevent the cleaning liquid supplied to the wafer W with the double-side cleaning device 7 and the cleaning atmosphere from influencing the hand shafts 12 and 32 or from leaking out of the processing chamber 5. The bellows 25 and 45 also prevent dust particles generated around driving portions (such as the motors M1, M2, the cylinders 22, 42, and the hand shafts 12 and 32) from entering the processing chamber 5.

Next, an explanation will be given to a wafer scrub-cleaning operation to be performed by the wafer cleaning apparatus.

Before the wafer cleaning operation, the retention hands 13 and 33 are located in standby positions where the retention hands 13 and 33 are retracted from retention positions (shown in FIG. 1) at which a wafer W is held, and the upper surface cleaning member 50 and the lower surface cleaning member 70 are located apart from the wafer W on standby. Upon completion of the preceding CMP process, a wafer W having subjected to the CMP process is supplied to a predetermined supply position within the processing chamber 5 by a transportation arm not shown. Then, the rods 23 and 43 of the cylinders 22 and 42 are retracted so that the retention hands 13 and 33 are moved toward each other. Thus, the peripheral edge of the wafer W is held by the respective retention rollers 16 and 36.

With the wafer W held by the retention rollers 16 and 36, the rotation drivers 64 and 84 are driven so that the upper cleaning member 50 and the lower cleaning member 70 are rotated. At the same time, the three-ports valves 58 and 78 are switched to connected the agent supplying paths 59 and 79 to the cleaning pipes 57 and 77, respectively. Thus, an agent is fed to the upper and lower surfaces of the wafer W from the cleaning liquid supplying nozzles 56 and 76.

Thereafter, the motors M1 and M2 are driven, whereby the respective retention rollers 16 and 36 are rotatively driven. Thus, the wafer W is rotated at a low speed. Further, the elevation drivers 55 and 75 are driven, so that the upper cleaning member 50 and the lower cleaning member 70 are moved toward each other. As a result, the wafer W held by the retention rollers 16 and 36 are sandwiched between the cleaning brushes 51 and 71, and the upper and lower surfaces of the wafer W are scrubbed with the cleaning brushes 51 and 71 with the agent supplied thereto for the scrub-cleaning. Thus, slurry and the like remaining on the upper and lower surfaces of the wafer W is removed.

Since the cleaning brushes 51 and 71 of the upper and lower cleaning members 50 and 70 cover surface portions of the wafer W from the center to the periphery of the wafer W, the entire upper and lower surfaces of the wafer W can be scrub-cleaned by rotating the wafer W at the low speed.

Upon completion of the wafer scrub-cleaning operation, the elevation drivers 55 and 75 are driven, whereby the upper cleaning member 50 and the lower cleaning member 70 are moved away from the wafer W. Then, the three-ports valve 58 and 78 are switched to connect the cleaning pipes 57 and 77 to the de-ionized water supplying paths 60 and 80, respectively. As a result, de-ionized water is supplied to the upper and lower surfaces of the wafer W from the cleaning liquid supplying nozzles 56 and 76. Thus, the agent and the like remaining on the upper and lower surfaces of the wafer W are washed away.

After a sufficient amount of de-ionized water is supplied to the wafer W for removal of the agent, the three-ports valves 58 and 78 are switched to stop the supply of the de-ionized water from the cleaning liquid supplying nozzles 56 and 76. At the same time, the driving of the rotation drivers 54 and 74 is stopped, whereby the rotation of the upper cleaning member 50 and the lower cleaning member 70 is stopped. Further, the driving of the motors M1 and M2 is stopped, so that the rotation of the wafer W is stopped.

FIG. 3 is a sectional view schematically illustrating a driving mechanism for rotatively driving the retention rollers 16. A driving mechanism for rotatively driving the retention rollers 36 has substantially the same construction as the driving mechanism for the retention rollers 16. Therefore, no explanation will be given to the driving mechanism for the retention rollers 36, but only the driving mechanism for the retention rollers 16 will be explained.

Referring to FIG. 3, a roller shaft 17b to which the central retention roller 16b out of the three retention rollers 16 is attached extends through a through-hole 90 formed in the base portion 15, and is rotatably supported by two bearings 91 respectively provided adjacent to opposite ends of the through-hole 90. A lower end of the roller shaft 17b is located in a space 92 formed in the base portion 15. Three pulleys 93, 94 and 95 are fitted around the roller shaft 17b in a vertically aligning relation within the space 92.

Roller shafts 17a and 17c to which the retention rollers 16a and 16c adjacent to the retention roller 16b are respectively attached extend through through-holes 96 and 97 formed in the base portion 15, and are each rotatably supported by two bearings 98, 99 provided adjacent to opposite ends of the through-hole 96, 97. Lower ends of the roller shafts 17a and 17c are located in the space 92, and pulleys 100 and 101 are respectively attached to the roller shafts 17a and 17c within the space 92.

As shown in FIG. 2, a pulley 103 is attached to an output shaft 102 of the motor M1. An endless belt 18 is stretched between the pulley 103 and the uppermost pulley 93 out of the three pulleys 93, 94 and 95 attached to the roller shaft 17a. As shown in FIG. 3, an endless belt 19 is stretched between the middle pulley 94 and the pulley 100 attached to the roller shaft 17a, and an endless belt 20 is stretched between the lowermost pulley 95 and the pulley 101 attached to the roller shaft 17c.

With this arrangement, when the motor M1 is driven, the rotation of the output shaft 102 of the motor M1 is transmitted to the roller shaft 17b via the belt 18, whereby the retention roller 16b is rotatively driven. A rotation force transmitted to the roller shaft 17b is further transmitted to the roller shafts 17a and 17c via the belts 19 and 20, respectively, whereby the retention rollers 16a and 16c are rotatively driven. That is, the retention rollers 16a, 16b and 16c on the side of the retention hand 13 are rotatively driven by the rotation force of the motor M1. Similarly, the three retention rollers 36 on the side of the retention hand 33 are rotatively driven by a rotation force of the motor M2. As a result, the wafer W held by the retention rollers 16 and 36 receives driving forces from the respective retention rollers 16 and 36. Thus, a rotation torque is applied to the wafer W to rotate the wafer W.

Figure 4A:
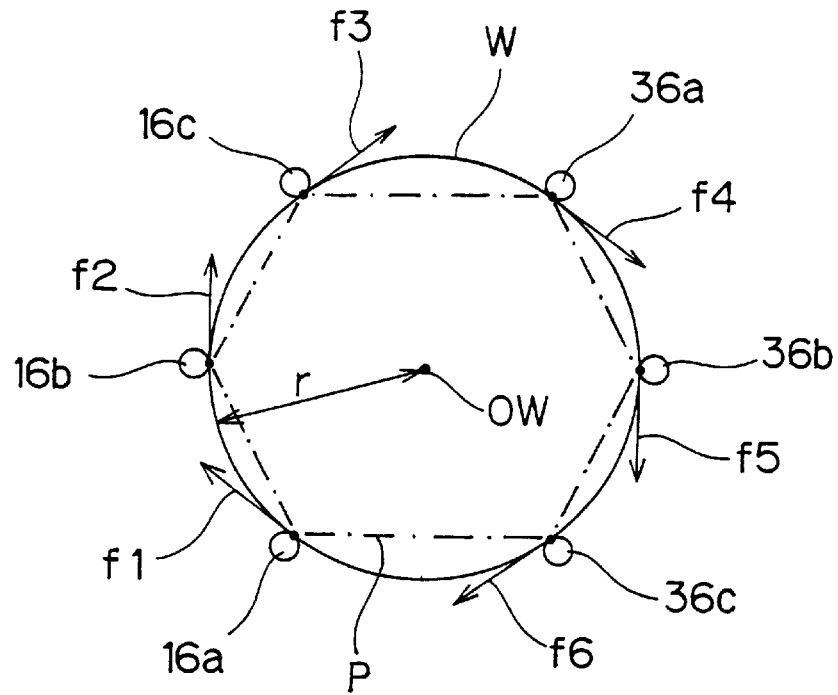
FIGS. 4A and 4B are diagrams for explaining the resultant force of driving forces received by a wafer from the retention rollers.
Figure 4B:
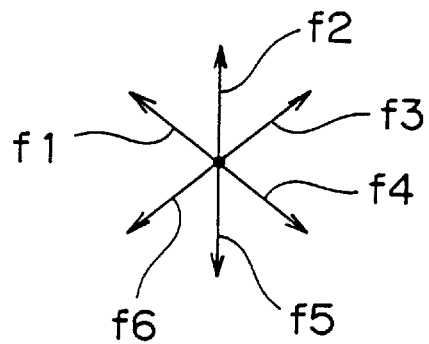

FIGS. 4A and 4B are diagrams for explaining the rotative driving forces and the rotation torque received by the wafer W from the retention rollers 16 and 36, and an eccentric force received by the overall wafer W.

The wafer W (having a radius r) held by the retention rollers 16 and 36 is rotated by the retention rollers 16 and 36, which are disposed in positions corresponding to vertexes of a phantom regular polygon P, thereby receiving rotative driving forces f1 to f6 respectively directed along common tangent lines from the retention rollers 16 and 36. As a result, a rotation torque of $(f1+f2+f3+f4+f5+f6) \times r$ is applied to the wafer W. It is herein assumed that the rotation forces transmitted to the retention rollers 16 and 36 from the motors M1 and M2 are equal to each other. Since the retention roller 16a is opposed to the retention roller 36a symmetrically about the center OW of the wafer W as described above, the rotative driving force f1 received by the wafer W from the retention roller 16a is equal in magnitude and opposite in direction to the rotative driving force f4 received by the wafer W from the retention roller 36a. Similarly, the driving force f2 received by the wafer W from the retention roller 16b is equal in magnitude and opposite in direction to the rotative driving force f5 received by the wafer W from the retention roller 36b, and the rotative driving force f3 received by the wafer W from the retention roller 16c is equal in magnitude and opposite in direction to the rotative driving force f6 received by the wafer W from the retention roller 36c.

Since the rotative driving forces f1, f2 and f3 are counterbalanced to the rotation driving forces f4, f5 and f6, respectively, as shown in FIG. 4B, the resultant force of the rotative driving forces f1 to f6 is zero. Therefore, the force (eccentric force) received by the overall wafer W from the retention rollers 16 and 36 is maintained at zero, while a rotation torque of $(f1+f2+f3+f4+f5+f6) \times r$ is applied to the wafer W. Thus, the wafer W is stably rotated. This prevents the wafer W from being heavily pressed against any of the retention rollers 16 and 36 during the rotation of the wafer W, thereby suppressing the generation of dust particles. In addition, the service life of the retention rollers 16 and 36 is not undesirable shortened.

Where the wafer cleaning apparatus is constructed such that the retention hands 13 and 33 respectively retaining the retention rollers 16 and 36 (see FIG. 1) can be moved in predetermined directions as in this embodiment, the retention hands 13 and 33 are not rigidly fixed to the wafer cleaning apparatus (or the side walls 2 and 4). Therefore, if the wafer W has a cut-way portion such as an orientation flat or a notch, the retention rollers 16 and 36 may be caught in the cut-away portion.

In accordance with this embodiment, however, the caught retention rollers 16 and 36 can readily come out of the cut-away portion because the retention rollers are all adapted to be rotatively driven. Therefore, undesirable stoppage of the rotation of the wafer W can be prevented which may otherwise occur when the retention rollers 16 and 36 fail to come out of the cut-away portion of the wafer W.

The rotative driving forces can assuredly be transmitted to the wafer W from the retention rollers 16 and 36 caught in the cut-away portion of the wafer W, so that the wafer W can receive a sufficient rotation torque.

Since the retention rollers 16 and 36 are all adapted to be rotatively driven in this embodiment, the rotation of the wafer W is not hindered by friction resistance which may otherwise be generated between the retention rollers 16 and 36 and the wafer W. Therefore, the wafer W can stably be rotated.

Figure 5:
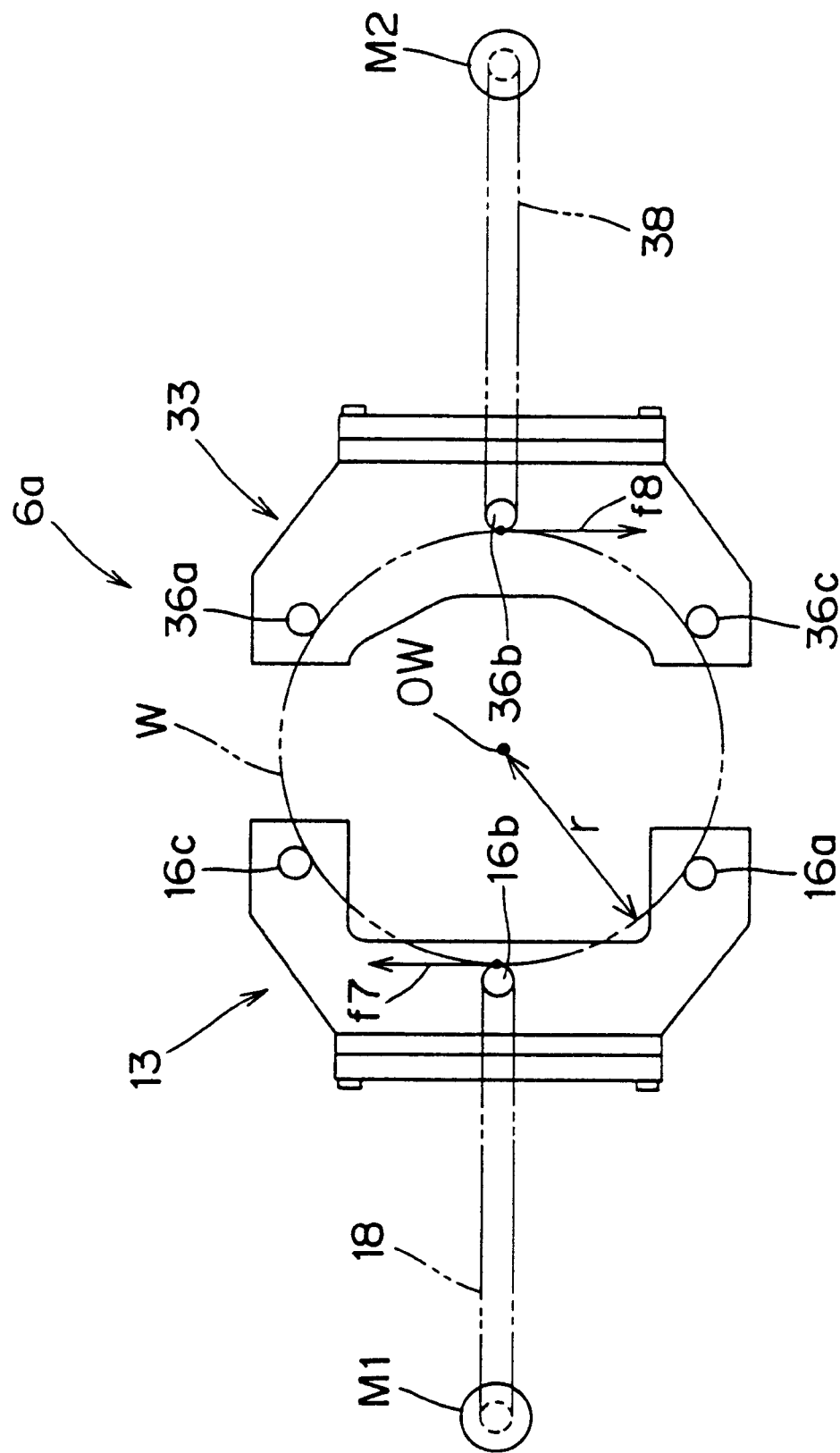
FIG. 5 is a plan view schematically illustrating the construction of a wafer retention mechanism according to a second embodiment of the present invention.

FIG. 5 is a plan view schematically illustrating the construction of a wafer retaining device according to a second embodiment of the present invention. In FIG. 5, only components relevant to the rotative driving of the retention rollers are shown, but the other components are not shown. The components equivalent to the components shown in FIG. 1 are denoted by the same reference numerals.

The wafer retaining device 6a according to the second embodiment is used in place of the wafer retaining device 6 shown in FIG. 1. Unlike the wafer retaining device 6 according to the first embodiment, the wafer retaining device 6a does not have the endless belts connecting the central retention roller 16b out of the three retention rollers 16 to the retention rollers 16a and 16c adjacent to the retention roller 16b for transmission of the rotation force of the motor M1 applied to the retention roller 16b, nor the endless belts connecting the central retention roller 36b out of the three retention rollers 36 to the retention rollers 36a and 36c adjacent to the retention roller 36b for transmission of the rotation force.

More specifically, the rotation force of the motor M1 is applied only to the retention roller 16b on the side of the retention hand 13, and the rotation force of the motor M2 is applied only to the retention roller 36b on the side of the retention hand 33. In other words, the rotation forces of the motors M1 and M2 are not applied to the retention rollers 16a and 16c on the side of the retention hand 13 nor to the retention rollers 36a and 36c on the side of the retention hand 33, so that these retention rollers 16a, 16c, 36a and 36c serve as following rollers to follow the rotation of the wafer W.

In accordance with the second embodiment, rotative driving forces f7 and f8 are applied to the wafer W having a radius r from the retention roller 16b on the side of the retention hand 13 and from the retention roller 36b on the side of the retention hand 33, respectively, so that a rotation torque of (f7+f8)×r is applied to the wafer W to rotate the wafer about the rotation center OW of the wafer W. In this case, since the retention roller 16b on the side of the retention hand 13 and the retention roller 36b on the side of the retention hand 33 are disposed in an opposed relation symmetrically about the center OW of the wafer W, the rotative driving force f7 applied from the retention roller 16b is opposite in direction to the rotative driving force f8 applied from the retention roller 36b. Therefore, the rotative driving force f7 is counterbalanced to the rotative driving force f8, so that the eccentric force exerted on the overall wafer W is maintained at substantially zero. Thus, the wafer W can stably be rotated.

Where the wafer retaining device 6a includes the following rollers (retention rollers 16a, 16c, 36a and 36c) to be rotated by the rotation of the wafer W as in the second embodiment, the following rollers on the side of the retention hand 13 and the following rollers on the side of the retention hand 33 are preferably disposed in an opposed relation symmetrically about the center OW of the wafer W. More specifically, the retention rollers 16a and 16c are preferably opposed to the retention rollers 36a and 36c, respectively, diametrically of the wafer W as shown in FIG. 5. With this arrangement, the resultant force of friction resistant forces generated between the wafer W and the respective retention rollers 16a, 16c, 36a and 36c is maintained at zero, whereby the wafer W can stably be rotated.

In summary, where the retention rollers 16 and 36 all serve as driving rollers to apply rotative driving forces to the wafer W as in the first embodiment, the retention rollers 16 and 36 are preferably disposed in such positions that the resultant force of the rotative driving forces received by the wafer W from the respective retention rollers 16 and 36 can be maintained at zero. Where the retention rollers 16 and 36 include driving rollers and following rollers as in the second embodiment, the retention rollers 16 and 36 are preferably disposed in such positions that the resultant force of rotative driving forces received by the wafer W from the respective driving rollers can be maintained at zero and the resultant force of friction resistant forces received by the wafer W from the respective following rollers can be maintained at zero.

Figure 6:
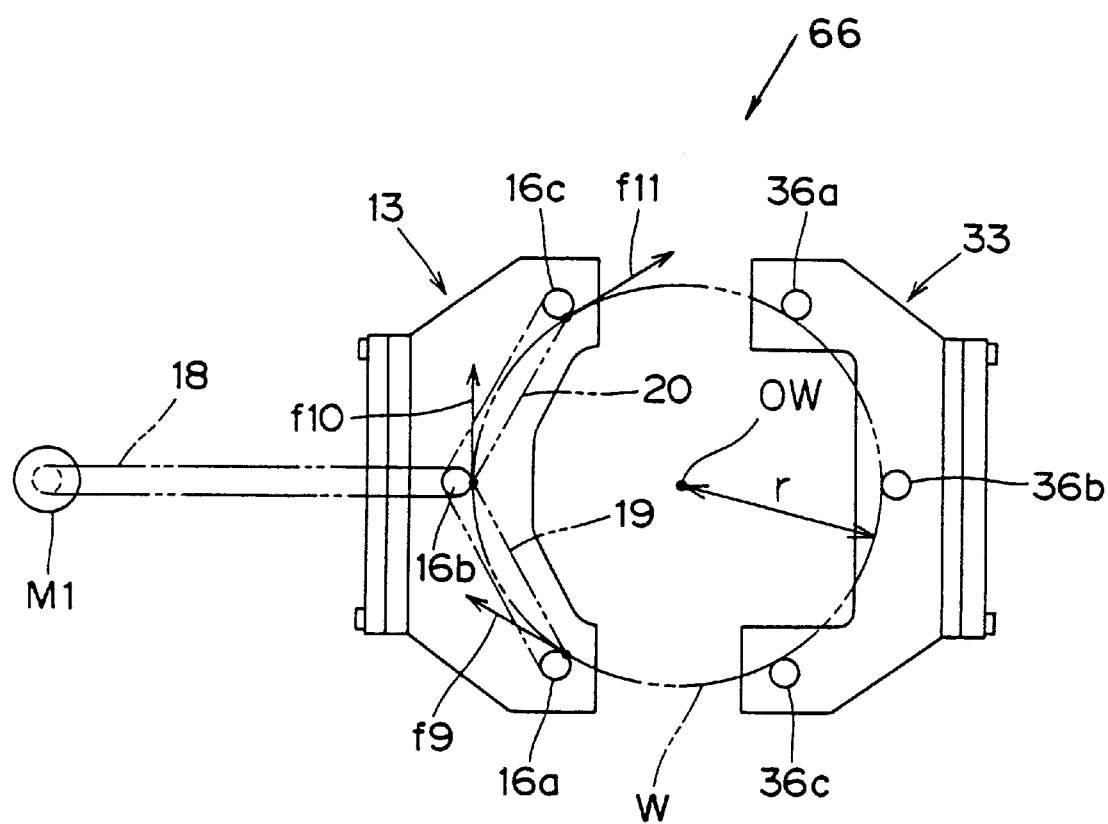
FIG. 6 is a plan view schematically illustrating the construction of a wafer retention mechanism according to a third embodiment of the present invention.

FIG. 6 is a plan view schematically illustrating the construction of a wafer retaining device according to a third embodiment of the present invention. In FIG. 6, only components relevant to the rotative driving of the retention rollers are shown, but the other components are not shown. The components equivalent to the components shown in FIG. 1 are denoted by the same reference numerals.

The wafer retaining device 6b according to the third embodiment is also used in place of the wafer retaining device 6 shown in FIG. 1. A difference in construction between the wafer retaining device 6b of the third embodiment and the wafer retaining device 6 of the first embodiment is as follows. While the wafer retaining device 6 is constructed such that the retention rollers 16 and 36 are all adapted to be rotatively driven, the wafer retaining device 6b is constructed such that the retention rollers 36 on the side of the retention hand 33 are not adapted to be rotatively driven but only the retention rollers 16 on the side of the retention hand 13 are adapted to be rotatively driven. More specifically, the wafer retaining device 6b does not include the motor M2 for rotatively driving the retention rollers 36 on the side of the retention hand 33 (see FIG. 1) nor the belts 38, 39 and 40 for transmitting the rotation force of the motor M2 to the retention rollers 36, but includes a driving mechanism provided on the side of the retention hand 13 for rotatively driving the retention rollers 16.

With this arrangement, when the motor M1 is driven, the rotation force of the motor M1 is transmitted via the belt 18 to the central retention roller 16b on the side of the retention hand 13, and further transmitted via the belts 19 and 20 to the two retention rollers 16a and 16c adjacent to the retention roller 16b. Then, the wafer W (having a radius r) held by the retention rollers 16 and 36 receives rotative driving forces f9, f10 and f11 from the three retention rollers 16 on the side of the retention hand 13. Thus, a rotation torque of (f9+f10+f11)×r is applied to the wafer W to rotate the wafer W about the rotation center OW of the wafer W.

Figure 7A:
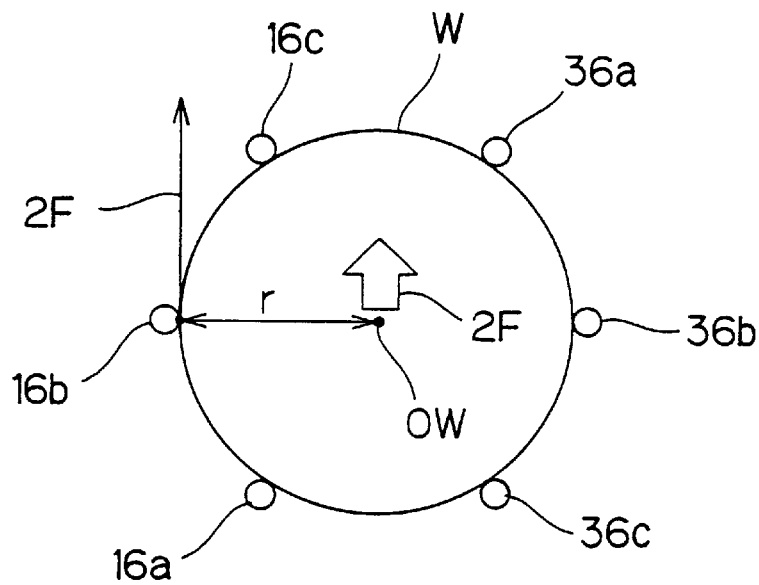
FIGS. 7A, 7B and 7C are diagrams for explaining advantages of the apparatus constructed such that a wafer can receive rotative driving forces from the plurality of retention rollers.
Figure 7B:
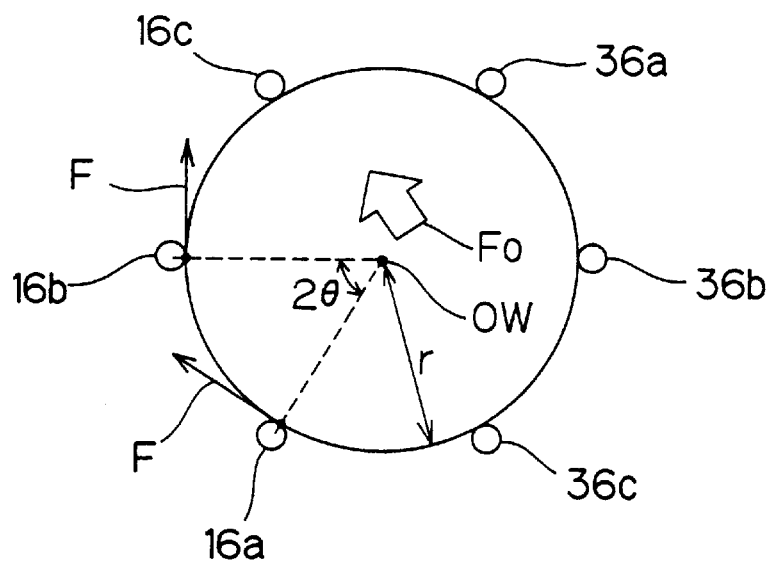
Figure 7C:
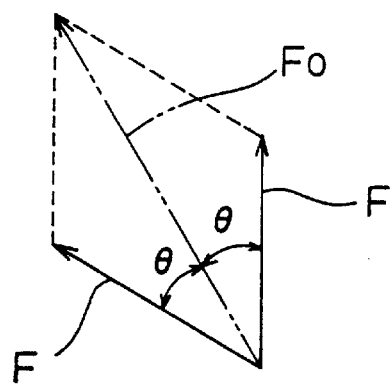
Figure 8:
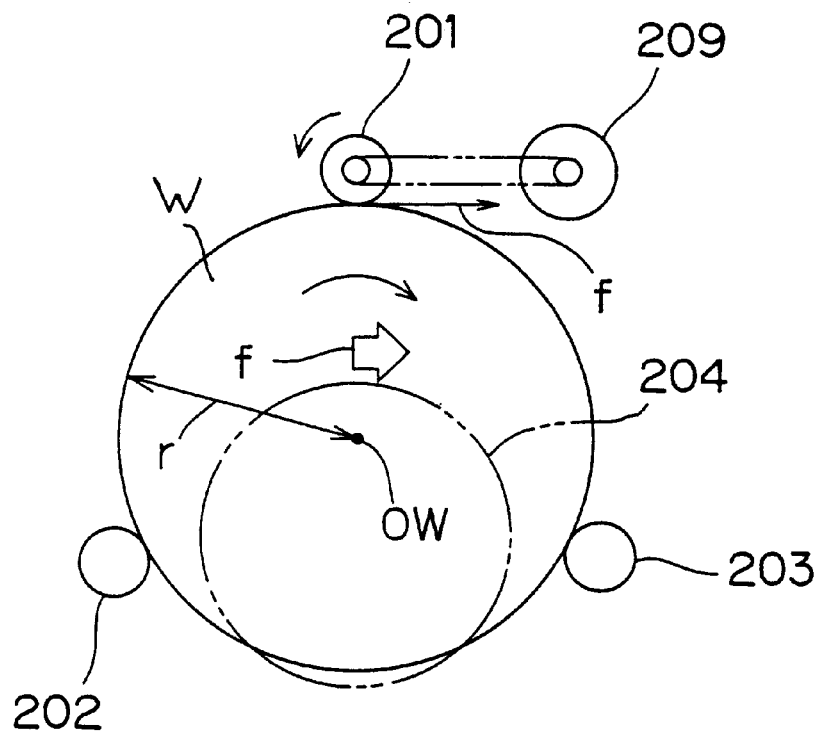
FIG. 8 is a plan view illustrating the construction of a prior art apparatus for cleaning a wafer.
Figure 9:
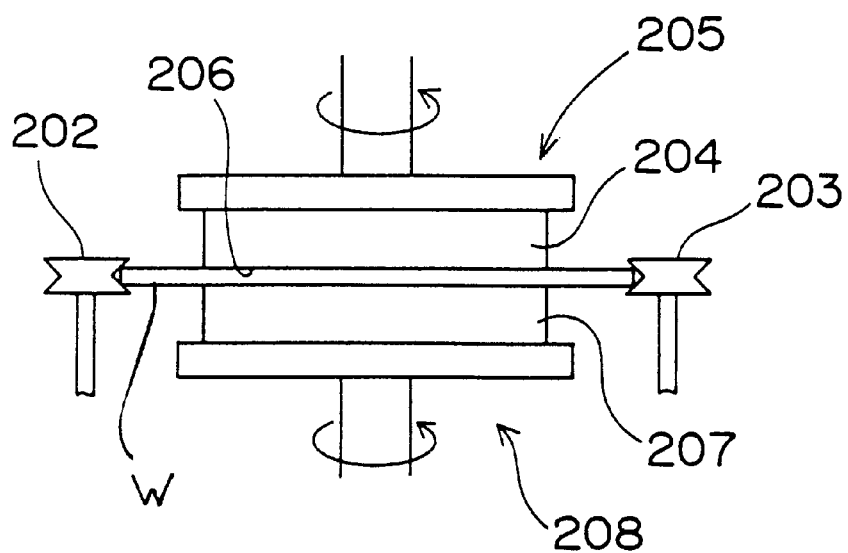
FIG. 9 is a side view of the prior art apparatus shown in FIG. 8.

In accordance with the third embodiment, the rotative driving forces from the three retention rollers 16 are distributively transmitted to the wafer W held by the retention rollers 16 and 36 to apply to the wafer W a rotation torque required for the rotation thereof. Therefore, the wafer W can be rotated more stably than a case where a rotative driving force is applied to the wafer W from a single retention roller for rotation of the wafer W.

Where the rotation torque required for the rotation of the wafer W is applied to the wafer W from the plurality of retention rollers, the wafer W can be rotated more stably than the case where the rotation torque is applied to the wafer W from a single retention roller. The reason will be described in greater detail with reference to FIGS. 7A, 7B and 7C.

It is herein assumed that a rotation torque of 2F×r is required to be applied to the wafer W having a radius r for rotating the wafer W at a predetermined rotation speed. Where a rotative driving force is applied to the wafer W from the single retention roller 16b, the eccentric force exerted on the overall wafer W is 2F (see FIG. 7A).

On the other hand, where the rotation torque required for the rotation of the wafer W is substantially evenly distributed to the wafer W having a radius r from the two retention rollers 16a and 16b out of the six retention rollers 16 and 36, a rotative driving force F is applied to the wafer W from each of the retention rollers 16a and 16b along a common tangent line with respect to the wafer W. As a result, a rotation torque of 2F×r can be applied to the overall wafer W as in the case shown in FIG. 7A (see FIG. 7B). Assuming that a line extending between the center of the retention roller 16a and the center OW of the wafer W forms an angle of 2θ ($0<2\theta\leq180°$) with respect to a line extending between the center of the retention roller 16b and the center OW of the wafer W, the resultant force (eccentric force) $F_0$ (see FIG. 7C) of the rotative driving forces F applied to the wafer W from the respective retention rollers 16a and 16b is given by the following equation:

$$F_0 = 2 \times F \times \cos\theta$$

Since $0<2\theta\leq180°$, the value of cosθ varies within a range of $0\leq\cos\theta<1$. The magnitude of the resultant force (eccentric force) $F_0$ is $F_0<2\times F$.

Therefore, the wafer retaining device constructed such that the rotative driving force F is applied to the wafer W from each of the two retention rollers 16a and 16b abutting against different peripheral edge portions of the wafer W provides a smaller resultant force (eccentric force) $F_0$ than the wafer retaining device constructed such that the rotative driving force 2F is applied to the wafer W from the single retention roller 16b, if a rotation torque of 2F×r is to be applied to the overall wafer W. Accordingly, the wafer W can be rotated more stably in the former case than in the latter case.

Where the retention rollers for applying the rotative driving forces to the wafer W are disposed in an opposed relation symmetrically about the center OW of the wafer W, i.e., where the angle 2θ is 180°, the resultant force $F_0$ exerted on the overall wafer W is zero as calculated from the above equation. Therefore, the wafer retaining devices according to the first and second embodiments can rotate the wafer W more stably.

While the embodiments of the present invention have thus been described, the invention is not limited to these embodiments. In the embodiments described above, six retention rollers are employed. However, the number of the retention rollers is not limited to six, but may be any number not less than three.

In the embodiments described above, the preferable arrangement of the retention rollers is such that the retention rollers (driving rollers) for applying rotative driving forces to a wafer W are opposed to each other diametrically of the wafer W, but the arrangement of the retention rollers is not limited to such arrangement. For example, the retention rollers may be disposed in vertexes of a phantom regular polygon in a plane parallel with the circular wafer W. In such a case, the resultant force (eccentric force) of rotative driving forces applied to the wafer W from the respective driving rollers is maintained at zero, so that the wafer can stably be rotated.

Although the embodiments described above are directed to the wafer cleaning apparatus, the present invention can be applied to any other apparatuses which are adapted to process a generally circular substrate, such as a glass substrate for a liquid crystal display device or a substrate for a plasma display panel (PDP), while maintaining the substrate.

While the present invention has been described in detail by way of the embodiment thereof, it should be understood that the foregoing disclosure is merely illustrative of the technical principles of the present invention but not limitative of the same. The spirit and scope of the present invention are to be limited only by the appended claims.

What is claimed is:

1. A substrate processing apparatus, comprising:
   a substrate retention mechanism having at least three rotatable retention rollers, including a plurality of driving rollers, for holding a generally circular substrate by abutting the retention rollers against different peripheral edge portions of the substrate and a pair of retention hands for rotatable supporting the at least three retention rollers, at least one of the pair of retention hands being retractable with respect to the other retention hand, the pair of retention hands each adapted to support at least one of the driving rollers; and
   a rotative driving mechanism coupled to the plurality of driving rollers for rotating the plurality of driving rollers.

2. A substrate processing apparatus as set forth in claim 1, wherein the plurality of driving rollers include a pair of driving rollers generally opposed to each other diametrically of a substrate to be held.

3. A substrate processing apparatus as set forth in claim 1, wherein the at least three retention rollers all serve as the driving rollers.

4. A substrate processing apparatus as set forth in claim 1, wherein the plurality of driving rollers are disposed in such positions that a resultant force of driving forces applied to the substrate from the respective driving rollers are maintained at substantially zero.

5. A substrate processing apparatus as set forth in claim 1, wherein the plurality of driving rollers are disposed in positions corresponding to vertexes of a phantom regular polygon in a plane parallel with the circular substrate held by the substrate retention mechanism.

6. A substrate processing apparatus as set forth in claim 1, wherein the at least three retention rollers include a plurality of following rollers to be rotated by the rotation of the substrate, the plurality of following rollers being disposed in such positions that a resultant force of friction resistant forces exerted on the substrate by the respective following rollers are maintained at substantially zero.

7. A substrate processing apparatus as set forth in claim 1, further comprising a double-side cleaning mechanism for cleaning opposite surfaces of the substrate held by the substrate retention mechanism.

* * * * *